(12) United States Patent
Lan et al.

(10) Patent No.: US 11,394,360 B2
(45) Date of Patent: Jul. 19, 2022

(54) RESONATOR DEVICE

(71) Applicant: QUALCOMM Incorporated, San Diego, CA (US)

(72) Inventors: Je-Hsiung Lan, San Diego, CA (US); Jonghae Kim, San Diego, CA (US); Ranadeep Dutta, Del Mar, CA (US)

(73) Assignee: QUALCOMM Incorporated, San Diego, CA (US)

( * ) Notice: Subject to any disclaimer, the term of this patent is extended or adjusted under 35 U.S.C. 154(b) by 381 days.

(21) Appl. No.: 16/692,774

(22) Filed: Nov. 22, 2019

(65) Prior Publication Data

US 2021/0159873 A1  May 27, 2021

(51) Int. Cl.
| | | |
|---|---|---|
| *H03H 9/02* | (2006.01) | |
| *H01L 41/18* | (2006.01) | |
| *H03H 3/007* | (2006.01) | |
| *H03H 9/17* | (2006.01) | |
| *H03H 9/54* | (2006.01) | |
| *H01L 41/04* | (2006.01) | |

(52) U.S. Cl.
CPC ......... *H03H 9/02015* (2013.01); *H01L 41/04* (2013.01); *H01L 41/183* (2013.01); *H03H 3/0072* (2013.01); *H03H 9/171* (2013.01); *H03H 9/54* (2013.01)

(58) Field of Classification Search
CPC .. H03H 9/02015; H03H 3/0072; H03H 9/171; H03H 9/54; H03H 3/02; H03H 2003/021; H03H 9/0547; H03H 9/1014; H01L 41/04; H01L 41/183
USPC ................. 333/133, 186, 187, 188, 193–196
See application file for complete search history.

(56) References Cited

U.S. PATENT DOCUMENTS 10,138,116 B2 * 11/2018 Cheng ................. B81C 1/00246
2012/0274647 A1   11/2012 Lan et al.

* cited by examiner

*Primary Examiner* — Rakesh B Patel
*Assistant Examiner* — Jorge L Salazar, Jr.
(74) *Attorney, Agent, or Firm* — Patterson+ Sheridan, L.L.P.

(57) ABSTRACT

Certain aspects provide an integrated circuit (IC) including a resonator. One example IC generally includes a substrate, a first oxide region disposed above the substrate, and a resonator. The resonator may include a piezoelectric layer, a second oxide region disposed below the piezoelectric layer and bonded to the first oxide region, and a cavity in the second oxide region, wherein at least a portion of the second oxide region is below the cavity.

20 Claims, 10 Drawing Sheets

RESONATOR DEVICE

FIELD OF THE DISCLOSURE

The present disclosure generally relates to integrated circuits and, more particularly, to an integrated circuit having a resonator.

BACKGROUND

Complementary metal-oxide-semiconductor (CMOS) devices are fundamental components for integrated circuits to implement digital logic. A CMOS device typically includes a p-type metal-oxide-semiconductor (PMOS) transistor used to pull an output up to logic high and an n-type metal-oxide-semiconductor (NMOS) transistor used to pull the output down to logic low, depending on an input signal provided to the gates of the PMOS and NMOS transistors. While CMOS devices may be used for digital signal processing for wireless communication, other types of electronic components may be used to serve various other functions such as signal amplification and filtering for wireless communication. For instance, a bulk acoustic wave (BAW) device may be used for filtering in wireless communication systems. A BAW is an acoustic wave traveling through a piezoelectric layer. BAW devices may be implemented as filters by converting electric energy to mechanical energy, and vice versa.

SUMMARY

Certain aspects provide an integrated circuit (IC). The IC generally includes a substrate, a first oxide region disposed above the substrate, and a resonator comprising a piezoelectric layer, a second oxide region disposed below the piezoelectric layer and bonded to the first oxide region, and a cavity in the second oxide region, wherein at least a portion of the second oxide region is below the cavity.

Certain aspects provide a method for fabricating an IC. The method generally includes forming a first oxide region above a substrate; forming a resonator by forming a piezoelectric layer, forming a second oxide region adjacent to the piezoelectric layer, and forming a cavity in the second oxide region, wherein at least a portion of the second oxide region is below the cavity; and bonding the first oxide region and the second oxide region.

Other aspects, advantages, and features of the present disclosure will become apparent after review of the entire application, including the following sections: Brief Description of the Drawings, Detailed Description, and the Claims.

DETAILED DESCRIPTION

Figure 1:
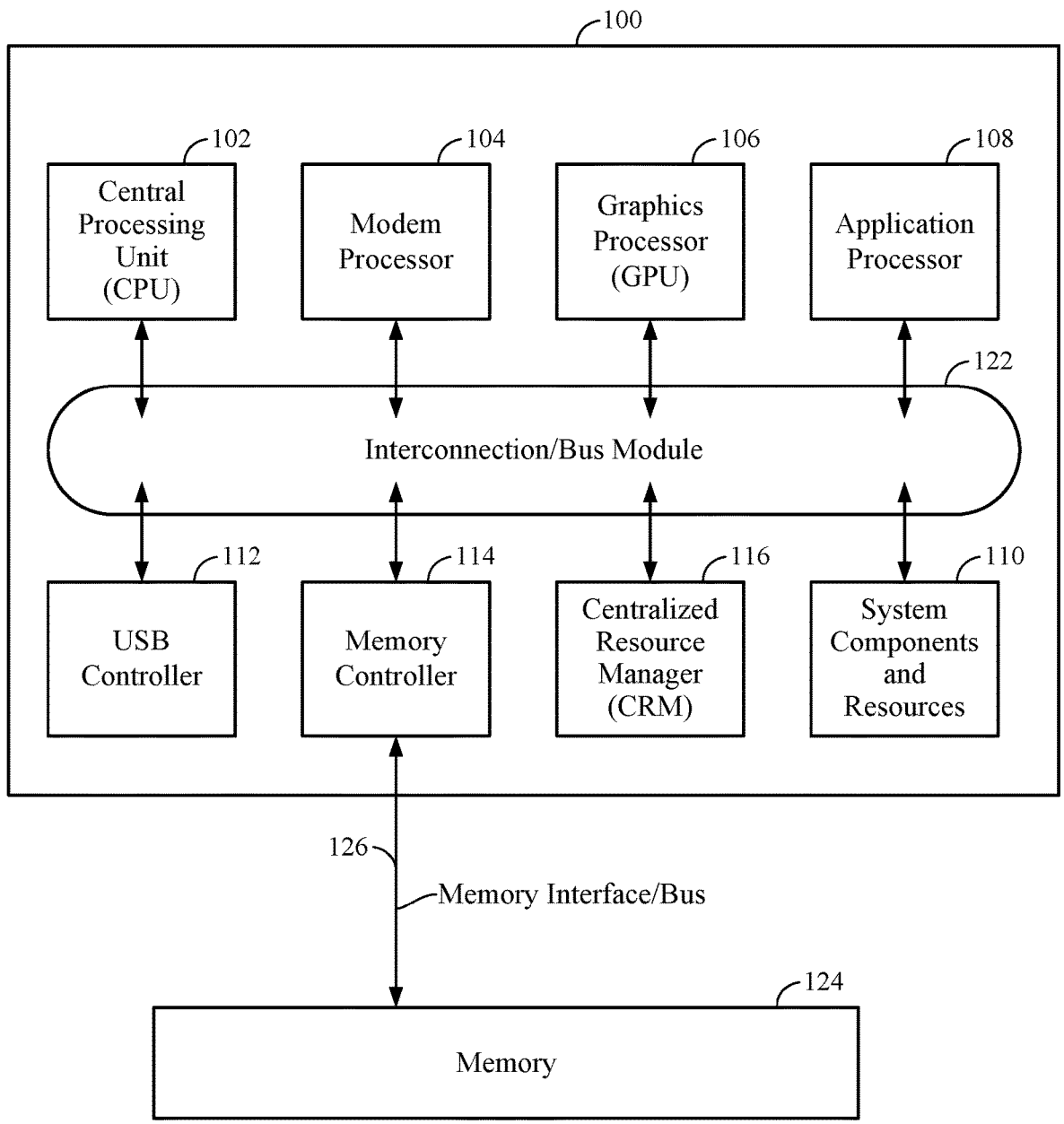
FIG. 1 illustrates an example implementation of a system-on-a-chip (SOC).

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultra-books, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., ROM, RAM, flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

An Example System-on-Chip

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture (e.g., CoreConnect, Advanced Microcontroller Bus Architecture (AMBA), etc.). Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 via a memory interface/bus 126. The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

An Example Resonator Device

In the current fifth-generation (5G) and coming sixth-generation (6G) era, wireless communications though an air interface over 10 gigabits per second (Gb/s) speed with low latency for various application is becoming more and more important. These applications may include autonomous driving, industry internet of things (IOT), remote medical operations/resources sharing, infotainment, gaming, education, and interactive-collaborations with artificial intelligence (AI), virtual reality (VR), augmented reality (AR), mixed reality (MR), and extended reality (XR) devices. Massive data transmission with live high-definition (HD) video and high fidelity voice over internet protocol (VoIP) audio content transmission for MR and XR involve both downlink and uplink speed much higher than 10 Gbps, which may be realized with millimeter wave (mmWave) communications that offer wider bandwidth.

In order to realize this demand, advanced semiconductor technologies for sub-6 GHz radio frequency integrated circuit (RFIC) and mmWave/monolithic microwave IC (MIMIC) front-ends have been developed. These semiconductor technologies may include gallium arsenide (GaAs) heterojunction bipolar transistor (HBT), high-electron-mobility transistor (HEMT), pseudomorphic high-electron-mobility transistor (pHEMT), indium phosphide (InP) double heterojunction bipolar transistor (DHBT), and gallium nitride (GaN) HEMT category III-V compound wide bandgap (WBG) semiconductors, along with advanced silicon complementary metal-oxide-semiconductor (CMOS) process technology nodes over bulk, silicon-on-insulator (SOI) and fully depleted (FD)-SOI process platforms that have been developed in the past decade for cutting-age modem, sensors, biometrics, and AI chips.

Certain aspects of the present disclosure are directed to a crystalline film bulk acoustic resonator (X-FBAR) device structure and method to form high electromechanical coupling coefficient ($k_T^2$) resonators and wideband filters with the process flow of using single crystalline aluminum nitride (AlN) (or scandium aluminum nitride (ScAlN)) piezoelectric film before micro-electromechanical systems (MEMS) air cavity formation. The X-FBAR device may be implemented as a standalone device implemented using oxide-to-oxide bonding, or integrated with silicon (Si)-CMOS circuitry on a three-dimensional (3D) integrated circuit (3DIC) with Cu-oxide hybrid bonding, which may offer wider bandwidth as compared with conventional polycrystalline and crystalline FBAR filters. For implementation of a monolithic 3DIC, integration of Si-based CMOS IC as a baseband logic controller with category III-V devices (e.g., GaAs pHEMT/metamorphic HEMT (mHEMT), InP DHBT, GaN-HEMT, etc.) for RF front-end key elements/blocks (e.g., power amplifier (PA), low noise amplifier (LNA), RF switch, and mixers) may be important for achieving power, performance, area, and cost (PPAC) advantages.

Besides a wider bandwidth of a filter having the single crystalline X-FBAR devices with higher electromechanical coupling coefficient ($k_T^2$) and integration with CMOS components such as power amplifier (PA), low-noise amplifier (LNA), switch (SW) and logic circuitry, certain aspects of the present disclosure provide additional benefits with respect to power, performance, area, and thermals. In other words, an FBAR implemented with a single crystalline AlN piezoelectric film may have a narrower full-width-at-half-maximum (FWHM), and thus, have a higher $k_T^2$ as compared to conventional FBAR implementations using a polycrystalline AlN film. The electromechanical coupling coefficient ($k_T^2$) is a measure of the electromechanical conversion capability of an acoustic layer of a resonator (e.g., FBAR). For example, certain aspects allow for relatively short RF paths that reduce the RF-related resistive and parasitic losses from FBAR to CMOS components through a laminate substrate. Moreover, a compact 3DIC chip size may be realized with die-to-wafer (D2W) or wafer-to-wafer (W2W) hybrid bonding of the X-FBAR with CMOS IC, which reduces the inter-module metal routing though the laminate substrate. Certain aspects of the present disclosure may also improve thermal performance of a device due to lower overall device temperature caused by lower RF losses.

Figure 2A:
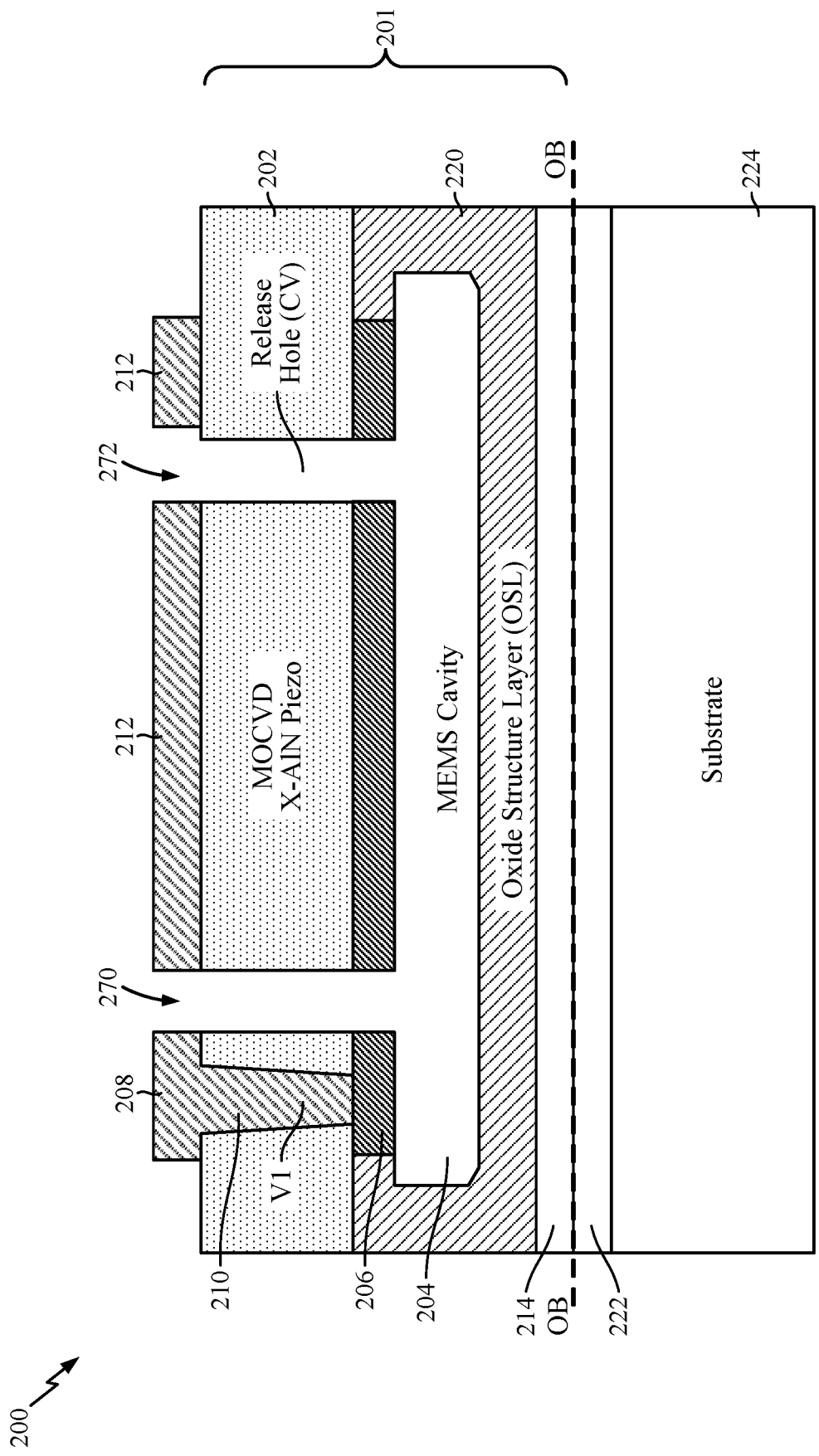
FIGS. 2A and 2B illustrate example integrated circuits (ICs) having a resonator, in accordance with certain aspects of the present disclosure.
Figure 2B:
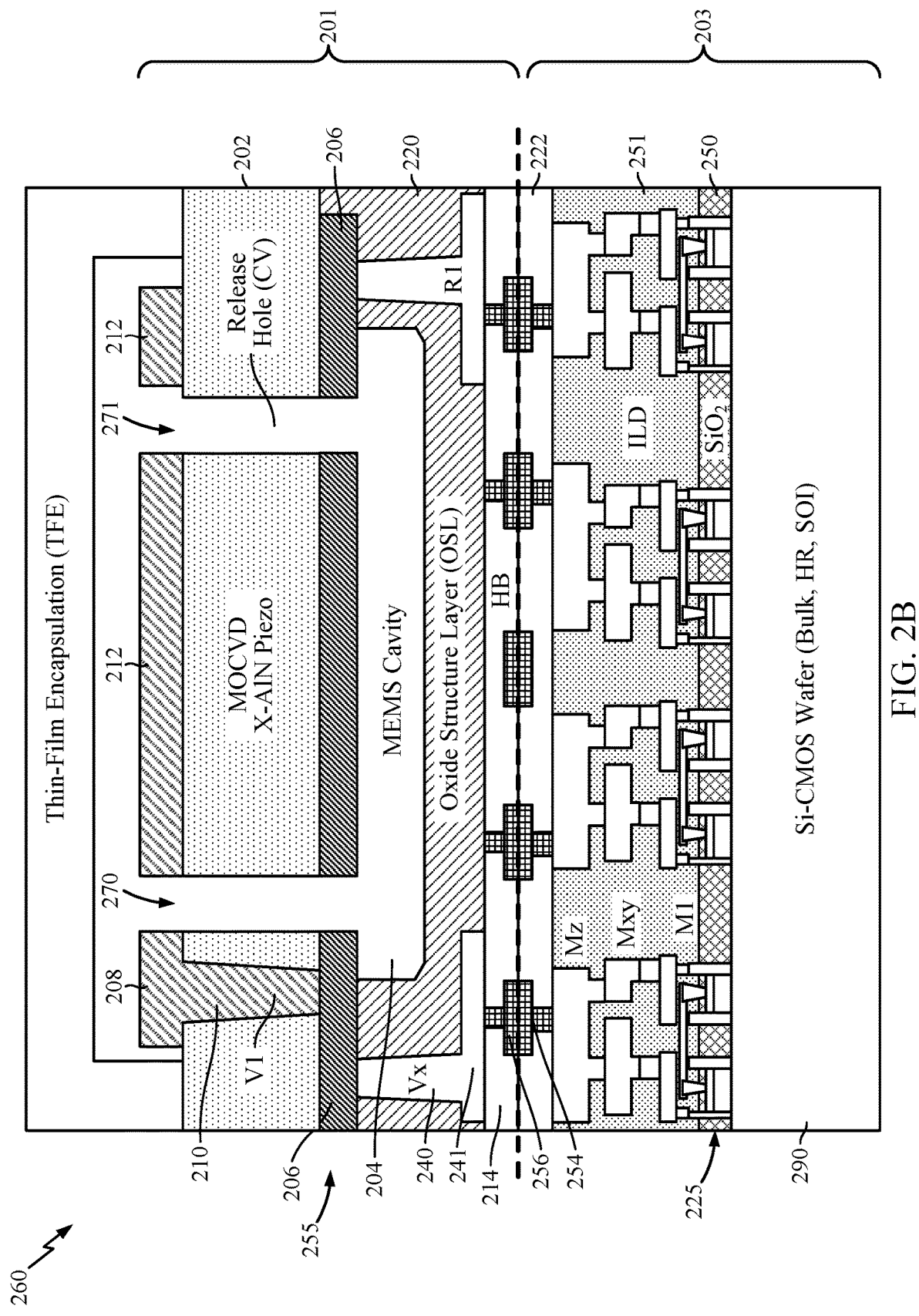

FIGS. 2A and 2B illustrate example integrated circuits (ICs) 200, 260 having a resonator 201 (e.g., X-FBAR), in accordance with certain aspects of the present disclosure. The resonator 201 includes a metal organic chemical vapor deposition (MOCVD)-AlN piezoelectric layer 202 (or a molecular beam epitaxy (MBE)-AlN piezoelectric layer) disposed over a micro-electro-mechanical systems (MEMS) cavity 204. The cavity 204 is formed in an oxide structure layer (OSL) 220.

The resonator 201 also includes a metal contact 206 adjacent to the cavity 204 forming a bottom electrode of the resonator 201. As illustrated, the metal contact 206 may be coupled to a metal contact 208 using a via 210 (e.g., V1) formed through the piezoelectric layer 202. A top electrode of the resonator 201 may be formed using the metal contact 212.

As illustrated, an oxide region 214 may be disposed below the OSL 220 which may be oxide bonded (OB) to an oxide region 222 formed on a substrate 224. One or more holes 270, 272 (e.g., also referred to as a "cavity via (CV)" or "release hole") may be formed through the OSL 220 and piezoelectric layer 202 for the formation of the cavity 204, as illustrated.

In certain aspects, the resonator 201 may be bonded to a CMOS IC 203, as illustrated in FIG. 2B. For example, CMOS components 225 may be formed above a substrate 290 (e.g., silicon (Si) CMOS wafer). Dielectric material 250 (e.g., silicon dioxide ($SiO_2$)) and interlayer dielectric (ILD) 251 may be disposed adjacent to the CMOS components, as illustrated. Copper contacts 254, 256 may be formed adjacent to the oxide regions 222, 214, respectively, which may be used for electrical connectivity with the CMOS components. The copper contacts 254, 256 may be bonded using a hybrid bonding (FIB) process. As illustrated, the metal contact 206 may be coupled to the copper contact 256 through the contact 241 and via 240 formed through the OSL 220. In certain aspects, an encapsulation element (e.g., thin-film encapsulation (TFE)) may be formed above the resonator 201.

Figure 3:
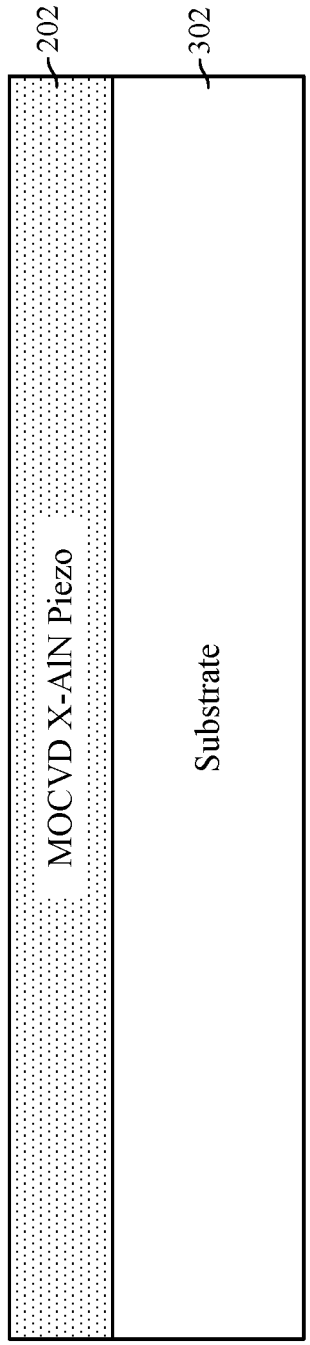
FIGS. 3, 4A, 4B, 5A, 5B, 6A, and 6B illustrate example operations or process flow for fabricating an IC, in accordance with certain aspects of the present disclosure.
Figure 4A:
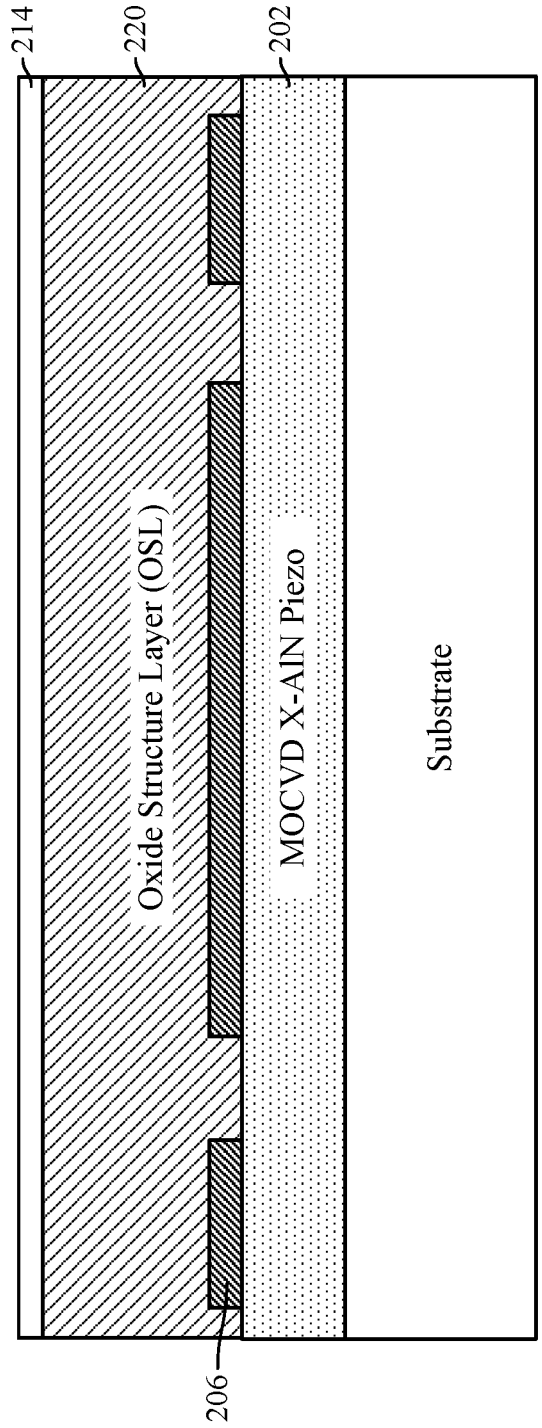

FIGS. 3, 4A, 5A, and 6A illustrate operations or a process flow for fabricating the IC 200, while FIGS. 3, 4B, 5B, and 6B illustrate operations or a process flow for fabricating the IC 260, in accordance with certain aspects of the present disclosure. As illustrated in FIG. 3, the piezoelectric layer 202 may be deposited on a substrate 302 (e.g., Si substrate). The piezoelectric layer 202 may be deposited using MOCVD. As illustrated in FIG. 4A, when forming the IC 200, the metal layer 255 (including the metal contact 206) may be patterned on the piezoelectric layer 202, and the OSL 220 may be formed above the patterned metal layer. In certain aspects, an oxide region 214 may be formed above the OSL 220.

Figure 4B:
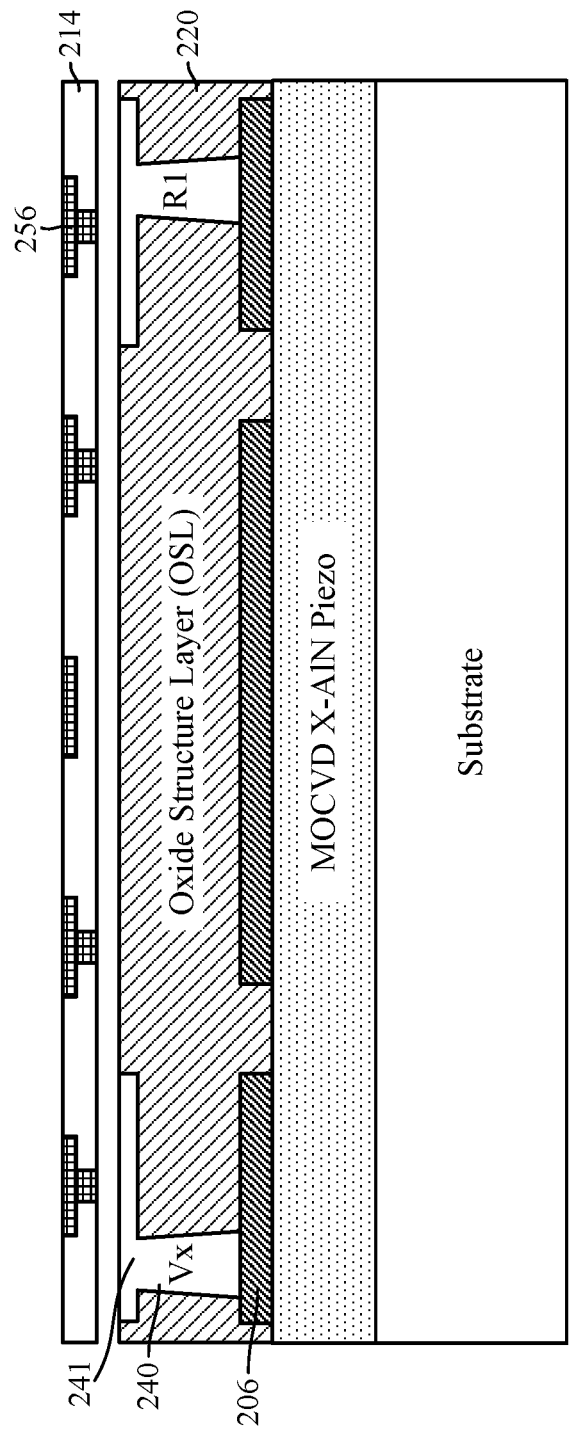

As illustrated in FIG. 4B, when forming the IC 260, vias and contacts may be formed for electrical coupling to the CMOS components of the CMOS IC 203. For example, contact 241 and via 240 may be formed through OSL 220, and copper contact 256 may be formed in the oxide region 214.

Figure 5A:
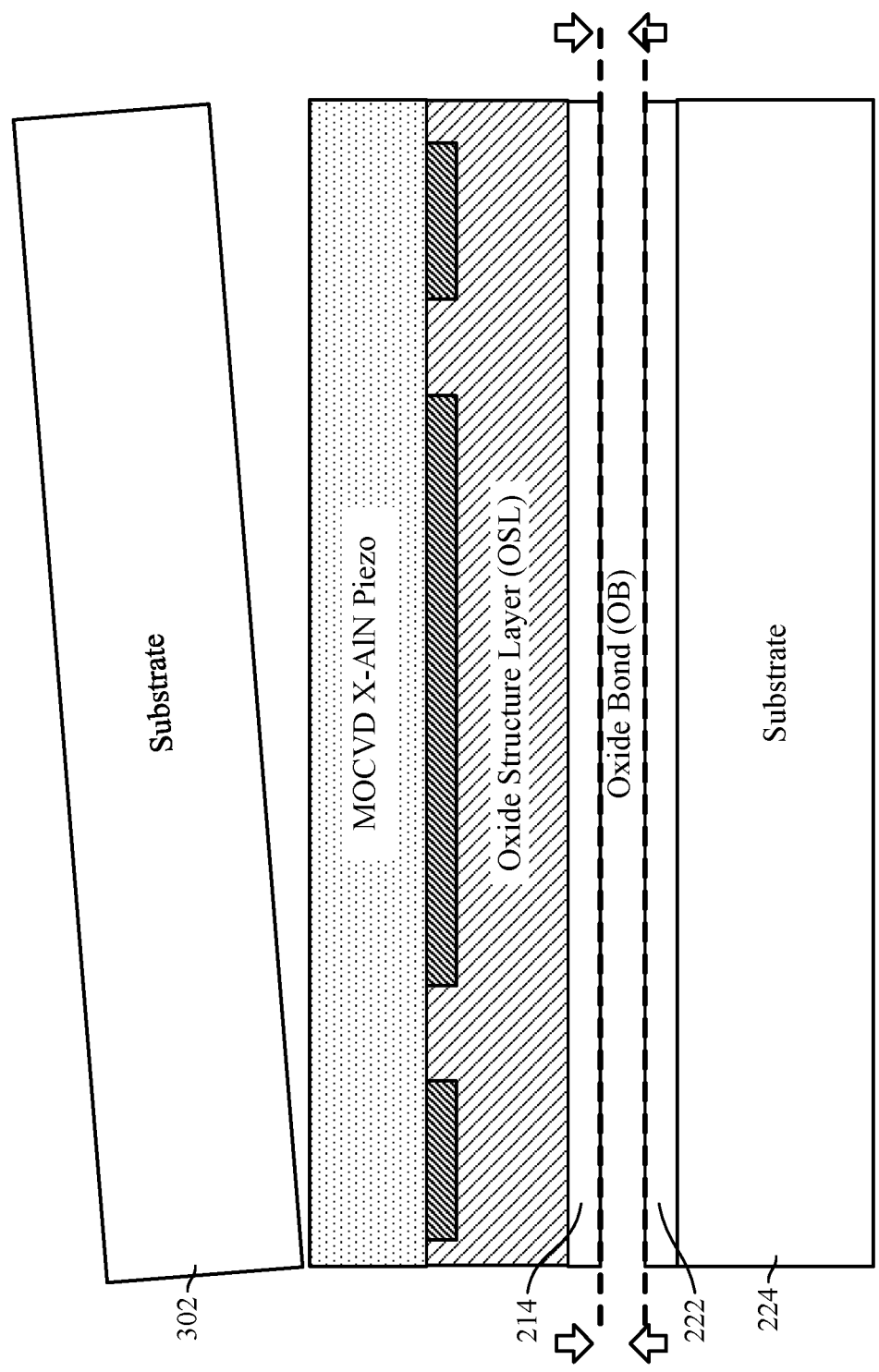
Figure 5B:
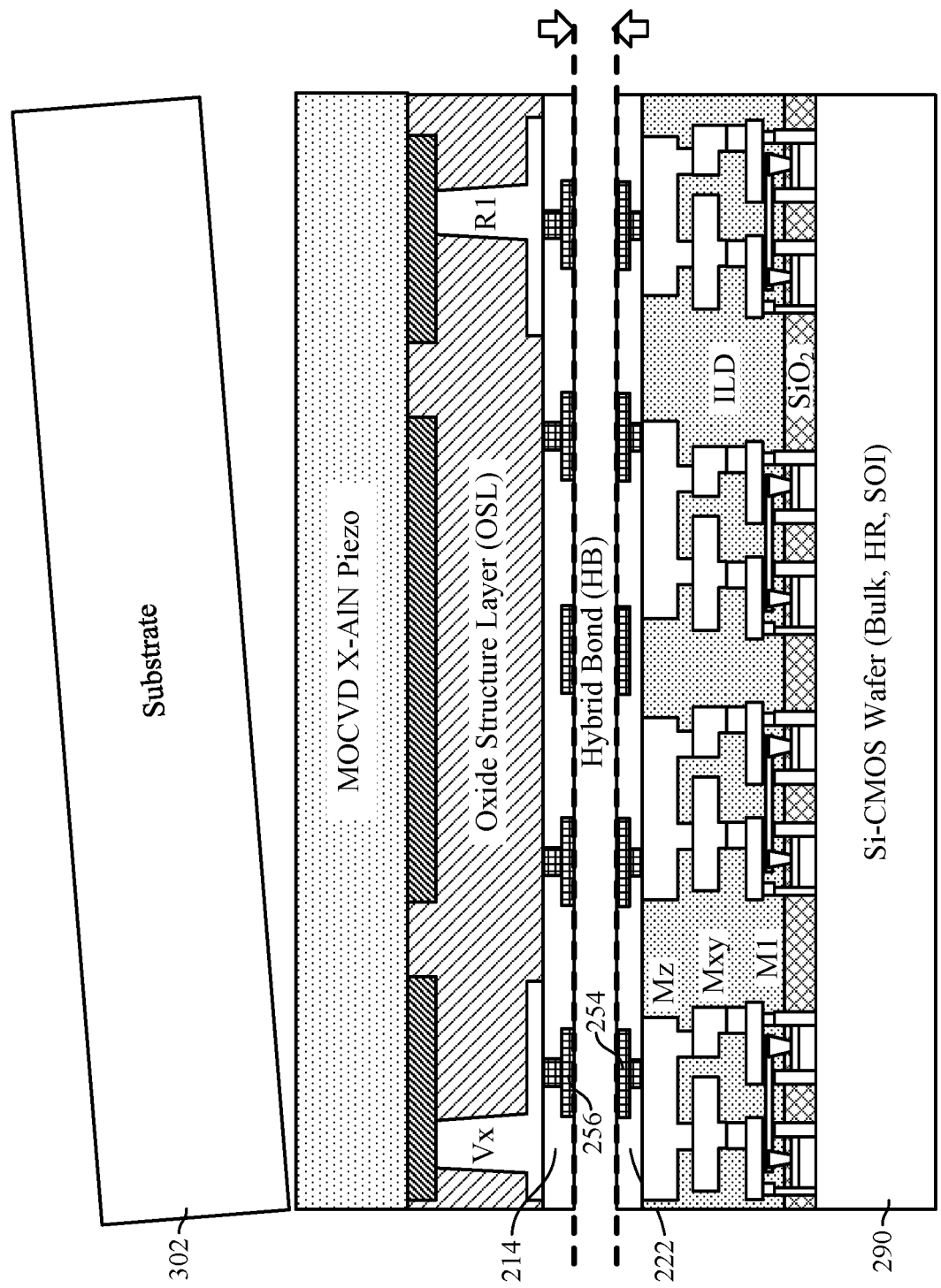
Figure 6A:
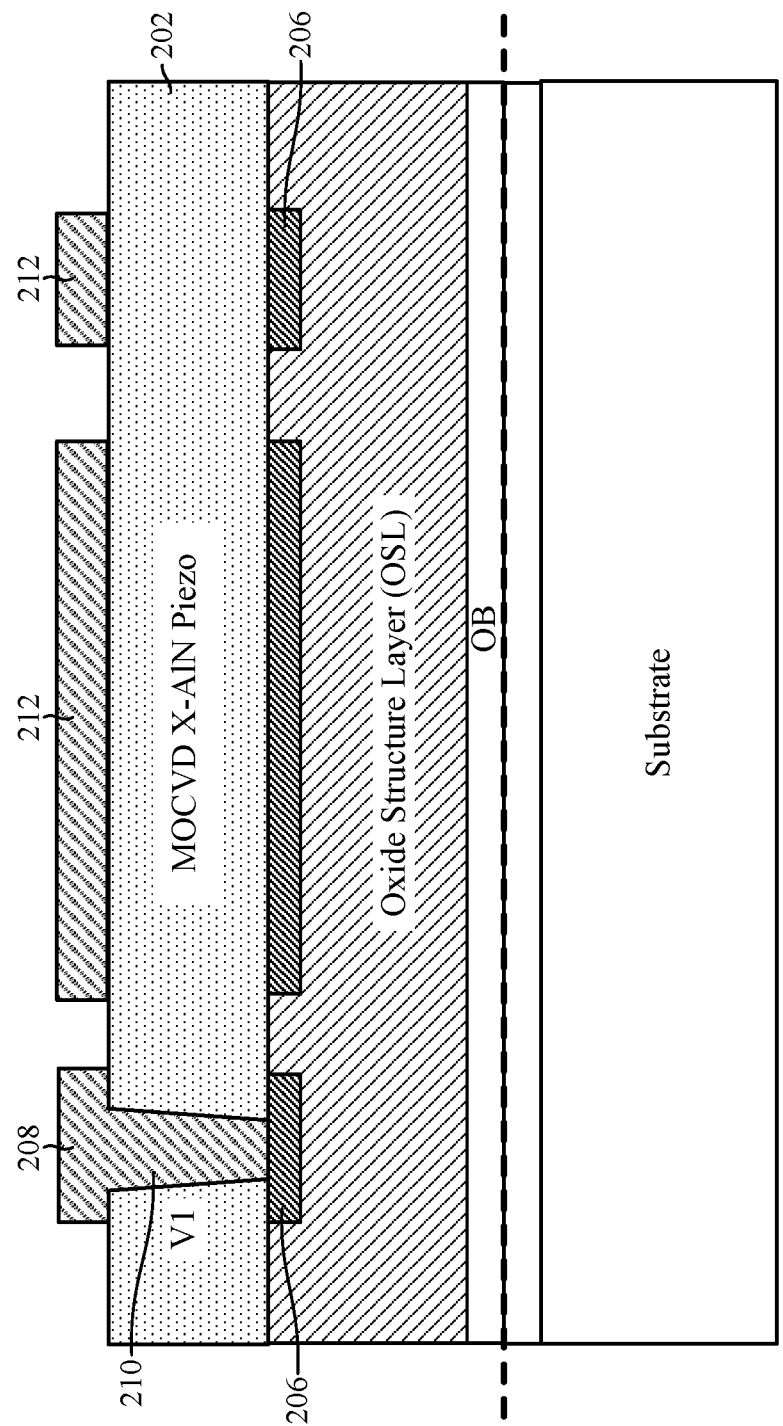
Figure 6B:
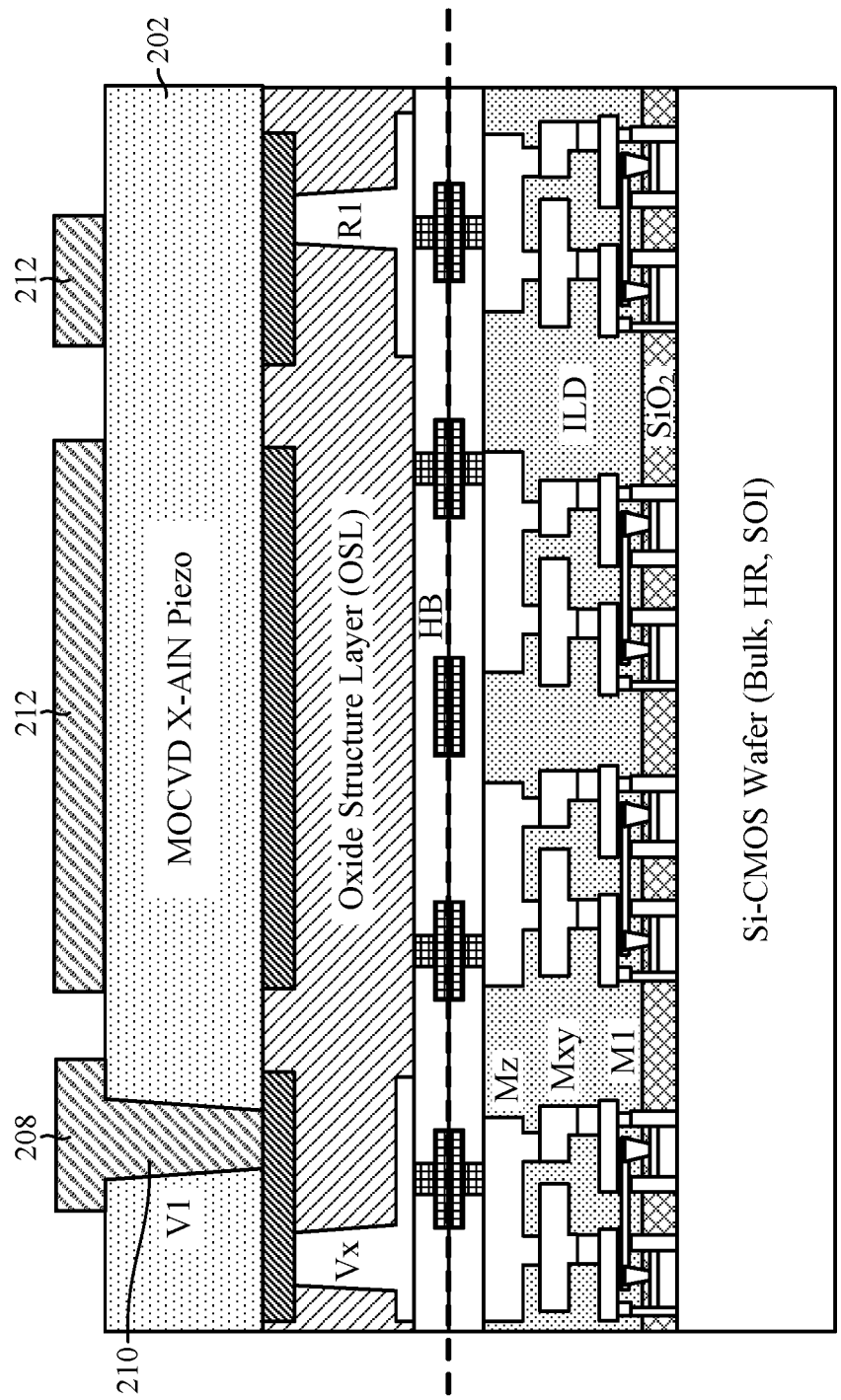

As illustrated in FIG. 5A, when forming the IC 200, the substrate 302 is flipped (i.e., inverted) onto the substrate 224 for oxide bonding of oxide regions 222, 214. Moreover, as illustrated in FIG. 5B, when forming the IC 260, the substrate 302 is flipped on the substrate 290 (e.g., CMOS wafer) for hybrid bonding. For example, oxide regions 222, 214 may be bonded, and the copper contacts 254, 256 may be bonded. As illustrated in FIGS. 5A and 5B, the substrate 302 may be removed (e.g., after bonding). As illustrated in FIGS. 6A and 6B, when forming respective ICs 200, 260, via and metal contacts (e.g., electrodes) may be formed for the resonator 201. For example, via 210 may be formed through the piezoelectric layer 202, the metal contact 208 may be formed above the piezoelectric layer 202, and the metal contact 212 may be formed above the piezoelectric layer 202. That is, metal contact 206 and the metal contact 212 may be formed on opposite sides (e.g., lower side and upper side) of the piezoelectric layer 202. As illustrated in FIGS. 2A and 2B, one or more holes 270, 272 are formed, allowing the formation of the cavity 204 (e.g., using a dry vapor hydrogen fluoride (HF) process to etch the OSL 220).

Figure 7:
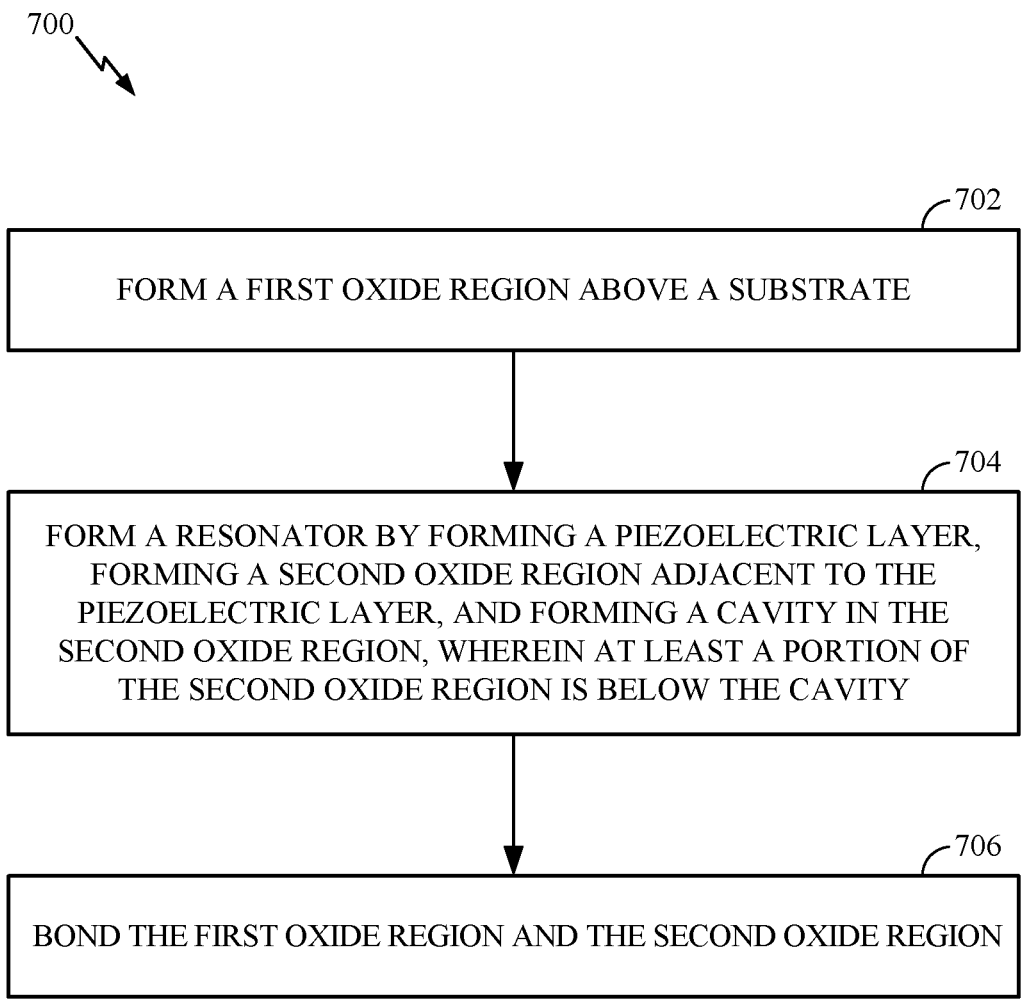
FIG. 7 is a flow diagram illustrating example operations for fabricating an IC, in accordance with certain aspects of the present disclosure.

FIG. 7 is a flow diagram illustrating example operations 700 for fabricating an IC, in accordance with certain aspects of the present disclosure. The operations 700 may be performed by a fabrication facility.

The operations 700 begin, at block 702, with the facility forming a first oxide region (e.g., oxide region 222) above a substrate (e.g., substrate 224), and at block 704 forming a resonator (e.g., resonator 201). The resonator may be formed by forming a piezoelectric layer (e.g., piezoelectric layer 202), forming a second oxide region (e.g., OSL 220 and oxide region 214) adjacent to the piezoelectric layer, and forming a cavity (e.g., cavity 204) in the second oxide region. At least a portion of the second oxide region is below the cavity (e.g., after inverting the resonator). At block 706, the facility bonds the first oxide region and the second oxide region.

In certain aspects, forming the cavity occurs after the bonding at block 706.

In certain aspects, the piezoelectric layer is formed above another substrate (e.g., substrate 302). In this case, the operations 700 may also include flipping the first oxide region over the second oxide region prior to the bonding of the first oxide region and the second oxide region, and removing the other substrate after the bonding of the first oxide region.

In certain aspects, the second oxide region include a first portion (e.g., OSL 220) in which the cavity is formed and a second portion (e.g., oxide region 214) that is bonded to the first oxide region. In certain aspects, forming the cavity may include forming one or more holes (e.g., holes 270, 271) through the piezoelectric layer.

The operations 700 may also include forming a first contact region (e.g., metal contact 206) such that the first contact region is between the piezoelectric layer and the second oxide region, and forming a second contact region (e.g., metal contact 212) adjacent the piezoelectric layer, the first contact region and the second contact region being adjacent to opposite sides of the piezoelectric layer. In certain aspects, the operations 700 may further entail forming one or more electronic components (e.g., CMOS components 225) above the substrate, the first oxide region being formed above the one or more electronic components. In certain aspects, the operations 700 may also include forming one or more first contacts (e.g., copper contact 254) in the first oxide region, forming one or more second contacts (e.g., copper contact 256) in the second oxide region, and bonding at least one of the one or more first contacts to a respective one of the one or more second contacts. In certain aspects, the second oxide region comprises a first portion (e.g., OSL 220) in which the cavity is formed and a second portion (e.g., oxide region 214) that is bonded to the first oxide region, the operations 700 further including forming a via (e.g., via 240) through the first portion and coupling the via to the one or more second contacts.

The various illustrative circuits described in connection with aspects described herein may be implemented in or with an integrated circuit (IC), such as a processor, a digital signal processor (DSP), an application-specific integrated circuit (ASIC), a field-programmable gate array (FPGA), or other programmable logic device. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is also noted that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An integrated circuit (IC) comprising:
a substrate;
a first oxide region disposed above the substrate; and
a resonator comprising:
    a piezoelectric layer;
    a second oxide region disposed below the piezoelectric layer and bonded to the first oxide region; and
    a cavity in the second oxide region, wherein at least a portion of the second oxide region is below the cavity.

2. The IC of claim 1, wherein the second oxide region comprises a first portion in which the cavity is disposed and a second portion that is bonded to the first oxide region.

3. The IC of claim 1, further comprising one or more holes formed through the piezoelectric layer to the cavity.

4. The IC of claim 1, further comprising:
a first contact region adjacent to a lower side of the piezoelectric layer; and
a second contact region adjacent to an upper side of the piezoelectric layer.

5. The IC of claim 1, further comprising one or more electronic components disposed between the substrate and the first oxide region.

6. The IC of claim 5, wherein the one or more electronic components comprise one or more complementary metal-oxide-semiconductor (CMOS) devices.

7. The IC of claim 5, further comprising:
one or more first contacts adjacent to the first oxide region; and
one or more second contacts adjacent to the second oxide region, wherein at least one of the one or more first contacts is bonded to a respective one of the one or more second contacts.

8. The IC of claim 7, wherein the second oxide region comprises a first portion in which the cavity is disposed and a second portion that is bonded to the first oxide region, the IC further comprising a via through the first portion of the second oxide region and coupled to the one or more second contacts.

9. The IC of claim 1, wherein the resonator further comprises an encapsulation element disposed above the piezoelectric layer.

10. The IC of claim 1, wherein the piezoelectric layer comprises a metal organic chemical vapor deposition (MOCVD)-aluminum nitride (AlN) piezoelectric layer or a molecular beam epitaxy (MBE)-AlN piezoelectric layer.

11. The IC of claim 1, wherein the resonator comprises a crystalline film bulk acoustic resonator.

12. A method for fabricating an integrated circuit (IC), comprising:
forming a first oxide region above a substrate;
forming a resonator by:
    forming a piezoelectric layer;
    forming a second oxide region adjacent to the piezoelectric layer; and
    forming a cavity in the second oxide region, wherein at least a portion of the second oxide region is below the cavity; and
bonding the first oxide region and the second oxide region.

13. The method of claim 12, wherein the piezoelectric layer is formed above another substrate, the method further comprising:

flipping the resonator such that the first oxide region is disposed over the second oxide region prior to the bonding of the first oxide region and the second oxide region; and removing the other substrate after the bonding.

14. The method of claim 12, wherein the second oxide region comprises a first portion in which the cavity is formed and a second portion that is bonded to the first oxide region.

15. The method of claim 12, wherein forming the cavity comprises forming one or more release holes through the piezoelectric layer and wherein the cavity is formed after the bonding.

16. The method of claim 12, further comprising:

forming a first contact region such that the first contact region is between the piezoelectric layer and the second oxide region; and forming a second contact region adjacent the piezoelectric layer, the first contact region and the second contact region being adjacent to opposite sides of the piezoelectric layer.

17. The method of claim 12, further comprising forming one or more electronic components above the substrate, the first oxide region being formed above the one or more electronic components.

18. The method of claim 17, wherein the one or more electronic components comprise one or more complementary metal-oxide-semiconductor (CMOS) devices.

19. The method of claim 17, further comprising:

forming one or more first contacts in the first oxide region;

forming one or more second contacts in the second oxide region; and bonding at least one of the one or more first contacts to a respective one of the one or more second contacts.

20. The method of claim 19, wherein the second oxide region comprises a first portion in which the cavity is formed and a second portion that is bonded to the first oxide region, the method further comprising:

forming a via through the first portion; and coupling the via to the one or more second contacts.

* * * * *